(12) United States Patent
Podell

(10) Patent No.: US 8,542,080 B2
(45) Date of Patent: Sep. 24, 2013

(54) ALL-PASS NETWORK

(75) Inventor: Allen F Podell, Palo Alto, CA (US)

(73) Assignee: Werlatone, Inc., Brewster, NY (US)

( * ) Notice: Subject to any disclaimer, the term of this patent is extended or adjusted under 35 U.S.C. 154(b) by 228 days.

(21) Appl. No.: 13/083,180

(22) Filed: Apr. 8, 2011

(65) Prior Publication Data

US 2012/0256700 A1  Oct. 11, 2012

(51) Int. Cl.
*H03H 7/48*  (2006.01)
*H03H 7/42*  (2006.01)
*H03H 7/19*  (2006.01)

(52) U.S. Cl.
USPC .............................. 333/124; 333/25; 333/138

(58) Field of Classification Search
USPC .............. 333/25, 26, 124, 138–140, 168, 177, 333/190
See application file for complete search history.

(56) References Cited

U.S. PATENT DOCUMENTS

| | | | |
|---|---|---|---|
| 1,953,459 A | 4/1934 | Bennett | |
| 2,029,698 A | 2/1936 | Bode | |
| 2,147,728 A | 2/1939 | Wintringham | |
| 2,392,476 A | 1/1946 | Hodgson | |
| 3,127,555 A | 3/1964 | Honore et al. | |
| 3,231,837 A | 1/1966 | O'Meara | |
| 3,449,696 A | 6/1969 | Routh | |
| 3,484,724 A | 12/1969 | Podell | |
| 3,518,581 A | 6/1970 | Hughes et al. | |
| 3,529,233 A | 9/1970 | Podell | |
| 4,994,773 A * | 2/1991 | Chen et al. | 333/164 |
| 2009/0134953 A1* | 5/2009 | Hunt et al. | 333/168 |

OTHER PUBLICATIONS

Mutual Inductance; http:/www.electronics-tutorials.ws, Oct. 11, 2009.*
U.S. Appl. No. 13/622,862, filed Sep. 19, 2012; inventor Allen F. Podell; title Single-Ended Phase-Shift Network.
Hellerstein, "Synthesis of All-Pass Delay Equalizers", IRE Transactions on Circuit Theory, Sep. 1961, pp. 215-222, vol. 8, issue 3.
Hunton, "New Differential Phase Shift Networks Combining All-Pass and Band-Pass Elements", Microwave Symposium Digest, Jun. 1981, I.E.E.E., pp. 223-225, Los Angeles, California.
Bedrosian, "Normalized Design of 90 Phase-Difference Networks", IRE Transactions on Circuit Theory, Jun. 1960, pp. 128-136, vol. 7, issue 2.
US Patent and Trademark Office, Office action regarding U.S. Appl. No. 13/622,862, Jan. 25, 2013, 19 pages.

* cited by examiner

*Primary Examiner* — Benny Lee
*Assistant Examiner* — Rakesh Patel
(74) *Attorney, Agent, or Firm* — Kolisch Hartwell, PC

(57) ABSTRACT

A phase-shift network may include a first capacitor connected between a first input node and a first output node, and a second capacitor connected between a second input node and a second output node. Further, a 5 first filter section may be connected between the first input node and the second output node, and a second filter section may be connected between the second input node and the first output node. One or both of the first and second filter sections may include an inductance and a high-pass network. The high-pass network may include third and fourth capacitors and a first inductor. The inductance and third and fourth capacitors may be connected in series between the respective input and output nodes. The first inductor may have a first end connected to an intermediate node between the third and fourth capacitors and a second end connected to a circuit ground.

8 Claims, 3 Drawing Sheets

ALL-PASS NETWORK

BACKGROUND OF THE DISCLOSURE

An all-pass network is a signal processing network that ideally passes all frequencies of circuit operation equally, but changes the phase relationship between various frequencies. It does this by varying its propagation delay with frequency. An all-pass network thus provides phase shift or phase delay without appreciably changing the magnitude characteristic of the signal. Hence, an all-pass network may also be considered a phase-shift network for operation in the radio frequency region.

Phase-shift networks having frequency cutoffs outside the bandwidth of interest are useful in high-frequency coupling circuits. Such networks may be employed in various forms of hybrid couplers or other directional coupling networks. In most such instances the phase-shift network preferably does not introduce a frequency limitation for the overall circuit. It is, of course, highly desirable that the network be low loss and be capable of compact construction. One phase-shift network which has frequently been employed, in the past, is a simple lattice network with series inductors and cross connected capacitors. Such a network provides the requisite one pole characteristic, has low loss and is economical in terms of both space and components. However, the simple lattice network may not be sufficient in terms of bandwidth because parasitic reactances become significant at high frequencies.

BRIEF SUMMARY OF THE DISCLOSURE

A phase-shift network may include a first capacitor connected between a first input node and a first output node, and a second capacitor connected between a second input node and a second output node. Further, a first filter section may be connected between the first input node and the second output node, and a second filter section may be connected between the second input node and the first output node. One or both of the first and second filter sections may include an inductance and a high-pass network. The high-pass network may include third and fourth capacitors and a first inductor. The inductance and third and fourth capacitors may be connected in series between the respective input and output nodes. The first inductor may have a first end connected to an intermediate node between the third and fourth capacitors and a second end connected to a circuit ground.

DESCRIPTION OF EMBODIMENTS

Figure 1:
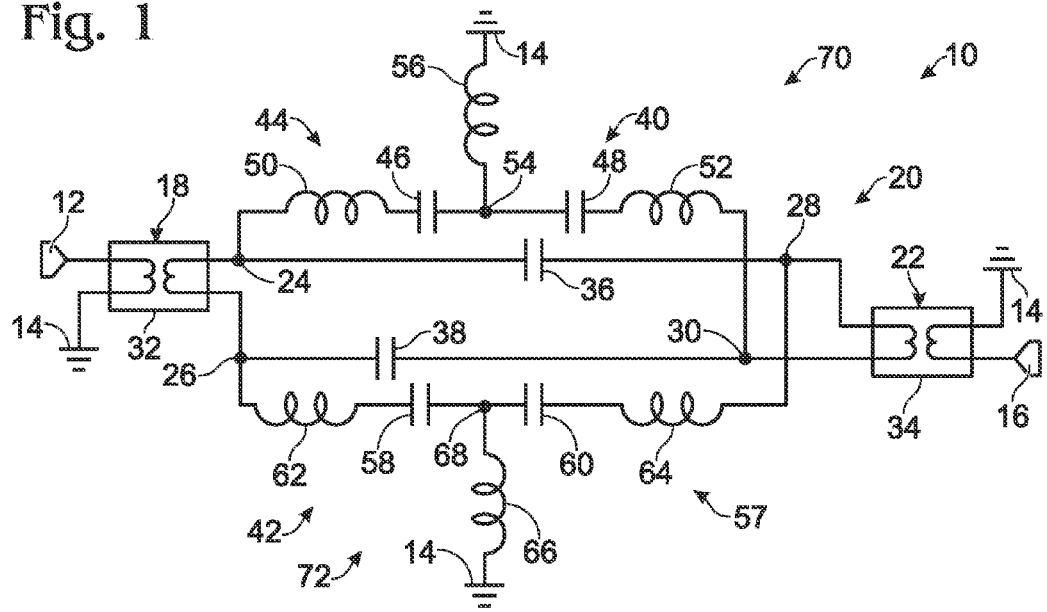
FIG. 1 is an example of a general circuit diagram showing a coupling network including a phase-shifting network and supporting input and output baluns for connecting an unbalanced source to an unbalanced load.

Referring initially to FIG. 1, a coupling circuit shown generally at 10 may couple an unbalanced signal or source to an unbalanced load. An unbalanced input signal may be received by coupling circuit 10 on a circuit input 12 relative to a circuit ground 14. Similarly, an unbalanced output signal may be transmitted by coupling circuit 10 on a circuit output 16 relative to circuit ground.

Coupling circuit 10 may include an input balun 18, a phase-shift network 20, and an output balun 22. Input balun 18 may be coupled to a first end of phase-shift network 20 at circuit nodes 24 and 26. Phase-shift network 20 may in turn be coupled to output balun 22 at circuit nodes 28 and 30. Input balun 18 may convert an unbalanced signal on circuit input 12 to a balanced signal at nodes 24 and 26. Conversely, output balun 22 may convert a balanced signal at nodes 28 and 30 to an unbalanced signal at circuit output 16. Baluns 18 and 22 are illustrated as respective transformers 32 and 34. It will be appreciated that other forms of baluns may also be used. In some examples involving balanced-signal circuits, the coupling circuit may not require baluns.

It is seen then in this example, that phase-shift network 20 has balanced input and output signals. Phase-shift network 20 may be symmetrical between the input and output nodes, in which case signal propagation may be in either direction. In this illustration, signal propagation is from left to right as viewed in FIG. 1.

Phase-shift network 20 may include a network of reactances, including a first capacitor 36 connected between input node 24 and output node 28. Similarly, a second capacitor 38 may be connected between input node 26 and output node 30. Additionally, in this example, a first filter section 40 may be connected between input node 24 and output node 30, and a second filter section 42 may be connected between input node 26 and output node 28.

Filter section 40 may include an inductance 44 and capacitors 46 and 48 connected in series between nodes 24 and 30. Inductance 44 is illustrated as the combination of an inductor 50 connected between node 24 and capacitor 46, and an inductor 52 connected between capacitor 48 and node 30. A second, shunt inductance 56 may couple an intermediate or filter node 54 to circuit ground. Intermediate node 54 may be disposed between capacitors 46 and 48.

Inductance 44 may include additional inductors in series with capacitors 46 and 48, or inductors in different positions between nodes 24 and 30. For example, inductance 44 may be distributed along a conductor extending between nodes 24 and 30 as is described below with reference of FIG. 2, or may be discrete elements as illustrated in FIG. 1 but in different locations.

Similarly, filter section 42 may include an inductance 57 and capacitors 58 and 60 connected in series between nodes 26 and 28. Inductance 57 may include an inductor 62 connected between capacitors 58 and 60, and an inductor 64 disposed between capacitor 60 and node 28. A second, shunt inductance 66 may couple an intermediate or filter node 68 to circuit ground. Node 68 is disposed between capacitors 58 and 60, and in this example between inductor 62 and capacitor 60.

Inductance 57 may include additional inductors in series with capacitors 58 and 60, or inductors in different positions between nodes 26 and 28. For example, inductance 57 may be distributed along a conductor extending between nodes 26 and 28, and it may include discrete elements as illustrated.

Each filter section may include a filter. In this example, filter section 40 includes a high-pass filter 70 and filter section 42 includes a high-pass filter 72. High-pass filter 70 may include series capacitor 46, shunt inductance 56, and series capacitor 48. Similarly, high-pass filter 72 may include series capacitor 58, shunt inductance 66, and series capacitor 60.

In summary, phase-shift network 20 thus may include a first capacitor 36 connected between a first input node 24 and a first output node 28, and a second capacitor 38 connected between a second input node 26 and a second output node 30. Further, a first filter section 40 may be connected between the first input node 24 and the second output node 30, and a second filter section 42 may be connected between the second input node 26 and the first output node 28.

One or both of the first and second filter sections may include a first inductance 44 or 62 and a high-pass network 70 or 72. High-pass network 70 or 72 may include third and fourth capacitors 46, 48 or 58, 60 and a first inductor 56 or 66. The first inductance 44 or 62 and third and fourth capacitors 46, 48 or 58, 60 may be connected in series between the respective input and output nodes 24, 30 or 26, 28. The first inductor 56 or 66 may have a first end connected to an intermediate node 54 or 68 between the third and fourth capacitors 46, 48 or 58, 60 and a second end connected to a circuit ground.

Figure 2:
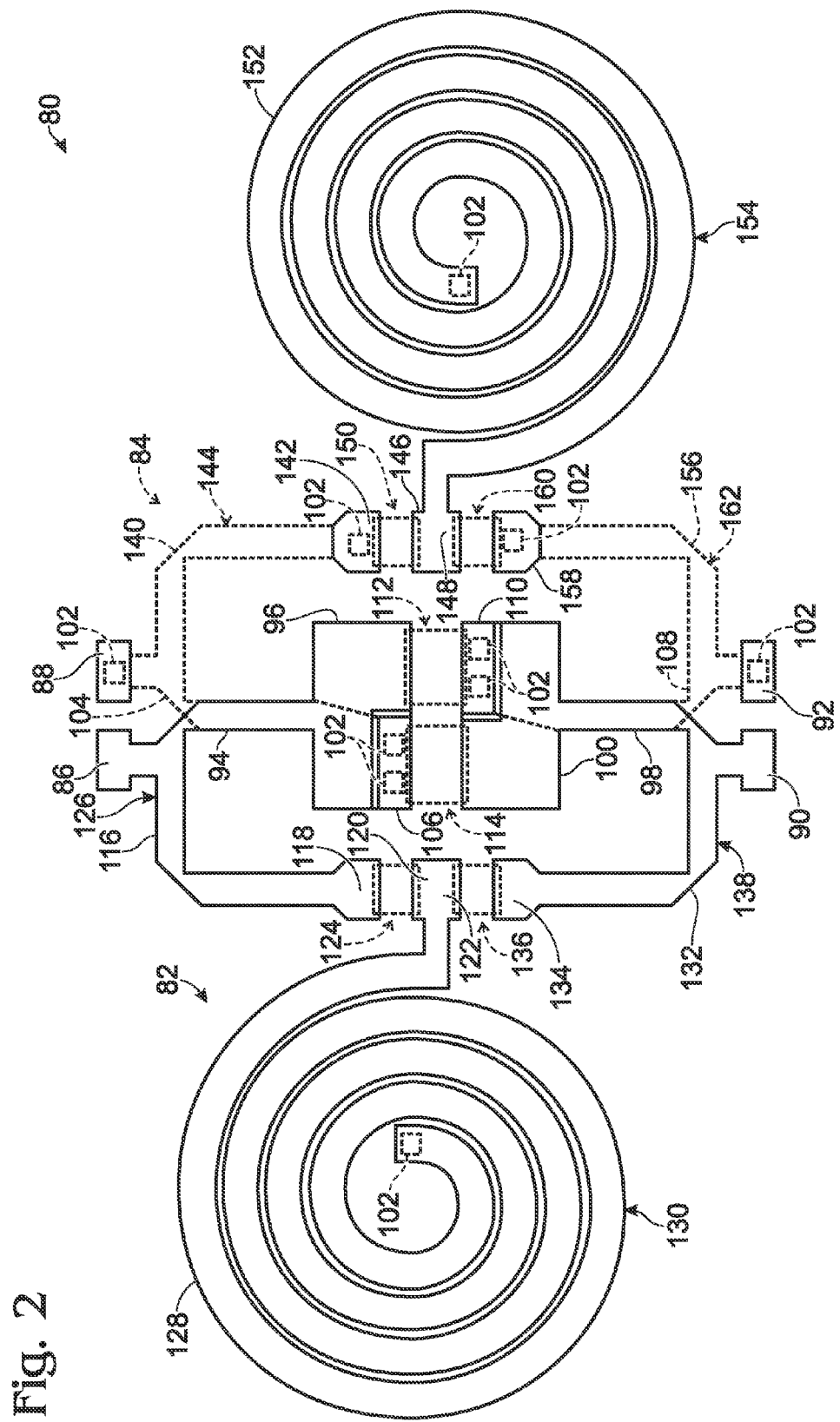
FIG. 2 is an illustration of an example of a printed circuit that may be used as the phase-shifting network of FIG. 1

One embodiment for realizing phase-shift network 20 is a phase-shift network 80, a representative illustration of metallization for which is shown in FIG. 2. Phase-shift network 80 includes a visible first layer 82 of metallization, shown in solid lines, separated from a hidden second layer 84 of metallization shown in dashed lines. Metallization layers 82 and 84 may be separated by a suitable dielectric having a thickness and dielectric constant appropriate for a selected design application, such as may be provided by an appropriate printed circuit board. It is seen that the metallization is compact and electrically symmetrical, allowing signal propagation in either direction between respective pairs of input and output nodes.

Phase-shift network 80 extends between balanced input nodes 86 and 88 and balanced output nodes 90 and 92. A first central conductor 94 extends on layer 82 between node 86 and an enlarged plate 96. A second central conductor 98 extends on layer 82 between node 90 and a similar enlarged plate. Vias 102 extend between metallization on the two layers at various locations.

A via 102 extends between node 88 and a third central conductor 104 on second layer 84. Conductor 104 extends below conductor 94 to vias 102 connected to a small plate 106 on layer 82 spaced from plate 96. Similarly, a via 102 extends between node 92 and a fourth central conductor 108 on second layer 84. Conductor 108 extends below conductor 94 to vias 102 connected to a small plate 110 on layer 82 spaced from plate 96.

Respective gaps exist between plates 96 and 110 as well as between plates 100 and 106. These pairs of opposed spaced-apart plates are mounting pads for mounting respective capacitors 112 and 114, shown in dashed lines, corresponding to capacitors 36 and 38, respectively, of phase-shift network 20.

A first outer conductor 116 extends on layer 82 between node 86 and a pad 118. A pad 120 spaced from pad 118 forms an intermediate node 122 corresponding to node 54 of phase-shift network 20. Pads 118 and 120 are spaced apart and a series capacitor 124, shown in dashed lines, corresponding to capacitor 46 of phase-shift network 20 is mounted to them. Conductor 116 produces inductance along its length, and accordingly forms an inductor 126 corresponding to inductor 50 of phase-shift network 20. A conductor 128 extends from pad 120 as a spiral to form an inductor 130. Inductor 130 couples node 122 to circuit ground, represented by a via 102 at the terminal end of conductor 128.

A second outer conductor 132 extends on layer 82 from a pad 134 to output node 90. Pads 120 and 134 are spaced apart, as shown, and a series capacitor 136, shown in dashed lines, corresponding to capacitor 48 of phase-shift network 20 is mounted to them. Conductor 132 produces inductance along its length, and accordingly forms an inductor 138 corresponding to inductor 52 of phase-shift network 20.

A third outer conductor 140 extends on layer 84 from a via 102 connected to node 88 and a via 102 connected to a pad 142 on layer 82. Conductor 140 produces inductance along its length, and accordingly forms an inductor 144 corresponding to inductor 62 of phase-shift network 20. A pad 146 spaced from pad 142 forms an intermediate node 148 corresponding to node 68 of phase-shift network 20. A series capacitor 150, shown in dashed lines, corresponding to capacitor 58 of phase-shift network 20 is mounted to pads 142 and 146. A conductor 152 extends from pad 146 as a spiral to form an inductor 154. Inductor 154 couples node 148 to circuit ground, represented by a via 102 at the terminal end of conductor 152.

A fourth outer conductor 156 extends on layer 84 from a via 102 connected to a pad 158 on layer 84, to a via 102 connected to output node 92. Pads 146 and 158 are spaced apart, as shown, and form mounting pads to which is mounted a series capacitor 160, shown in dashed lines, corresponding to capacitor 60 of phase-shift network 20. Conductor 156 produces inductance along its length, and accordingly forms an inductor 162 corresponding to inductor 64 of phase-shift network 20.

It will therefore be appreciated that a phase-shift network 20 is realizable in a compact two-layer configuration, such as on a printed circuit board. Other configurations and embodiments will also be apparent to one skilled in the art.

Figure 3:
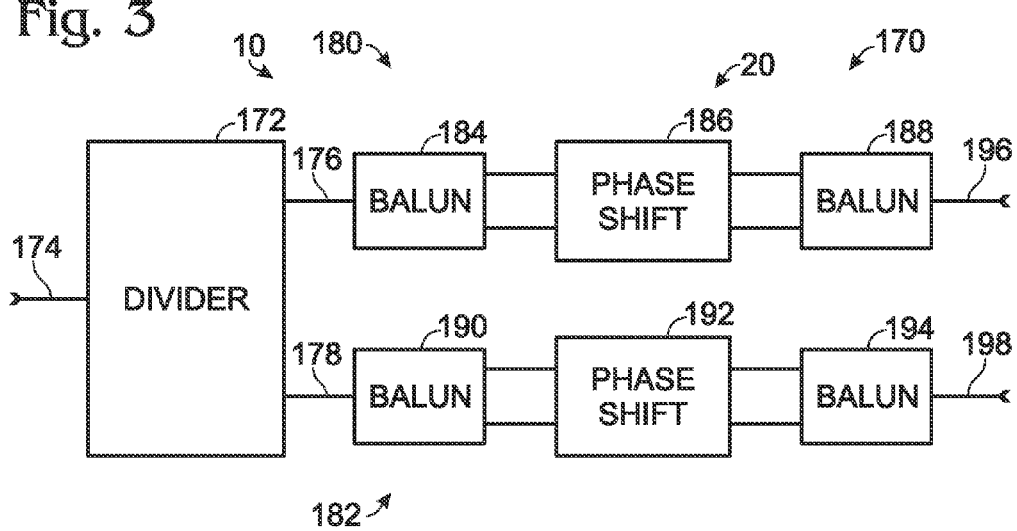
FIG. 3 is a block diagram of a phase-difference network that may include coupling networks of FIG. 1.

Phase-shift network 20 and coupling circuit 10 may be used as components in other circuits as well. For instance, an example of a phase-difference network 170 that may be formed with at least one coupling circuit 10 is illustrated in FIG. 3. Phase-difference network 170 may include a signal divider 172 having an input 174 for receiving an unbalanced input signal and two signal outputs 176 and 178 for outputting two unbalanced intermediate signals. A coupling circuit may be coupled to each output of divider 172. More specifically, a coupling circuit 180, corresponding to coupling circuit 10 shown in FIG. 1, may be coupled to output 176 and a coupling circuit 182 may be coupled to output 178.

As with coupling circuit 10, coupling circuit 180 may include an input balun 184, a phase-shift network 186, and an output balun 188. Similarly, coupling circuit 182 may include an input balun 190, a phase-shift network 192, and an output balun 194. Balun 188 may produce an unbalanced phase-difference-network output signal on an output 196, and balun 194 may produce an unbalanced output signal on an unbalanced phase-difference-network output 198.

Phase-difference network 170 may be designed to operate at a design frequency or over a given frequency bandwidth. The phase-difference network may produce output signals on outputs 196 and 198 that vary in phase and that have a relatively constant phase difference (within a range of variation) between the signals as a function of frequency.

In some examples, phase-shift networks 186 and 192 may vary in phase shift produced from near zero phase shift at lower frequencies and higher phase shift at higher frequencies. As a further example, the phase shift for one or both of the two phase-shift networks may approach or reach 180-degrees at the upper end of an operating bandwidth. In yet further examples, the two phase-shift networks may shift the phases of the respective signals by a generally consistent amount. For example, the difference in phase of the two output signals may be near or at 90-degrees over the bandwidth of the phase-difference network 170.

In an example of phase-difference network 170 designed for operation over a frequency range of 20 MHz to 1 GHz, phase-shift network 186 includes capacitors 36 and 38 of about 22 pF each, capacitors 46, 48, 58 and 60 of about 1000 pF each, series inductors 50, 52, 62, and 64 of about 7 nH each, and shunt inductors 56 and 66 of about 102 nH.

In this example, phase-shift network 192 may be any phase-shift network that provides a sufficiently consistent phase difference relative to the phase-shift produced by phase-shift network 186. For example, phase-shift network 192 may include a conventional lattice network, not shown, with in-line inductors of about 64 nH each, and cross capacitors of about 102 pF each. Phase-shift network 192 may also include one or more delay lines, not shown, that may be located within the coupling circuit at a suitable location to contribute a corresponding fixed phase offset in the associated signal path. For example, coupling circuit 182 may include a delay line connected to the lattice network, to provide a selected total phase shift in combination for phase-shift network 192 and therefore coupling circuit 180.

An example of the circuit of FIG. 3 was designed with phase-shift networks 186 and 192 having alternating rollover frequencies along the bandwidth. A rollover frequency is a frequency at which time delay produced by a network is at a local maximum. A simple phase-shift network thus may have a single rollover frequency. A complex phase-shift network may have multiple rollover frequencies. Where phase-shift networks are used in each of two coupling circuits of a phase-difference network, as shown in FIG. 3, it may be preferable for the phase-shift networks to have non-coincidental, or even alternating rollover frequencies.

For the frequency range of 20 MHz to 1 GHz, phase-shift network 186 might ideally have rollover frequencies at 10 MHz and 160 MHz (four times 40 MHz), and phase shift network 192 might ideally have rollover frequencies at 40 MHz (four times 10 MHz) and 640 MHz (four times 160 MHz). A simulation of phase-difference network 170 with the reactance values given above produced rollovers at about 23 MHz, 80 MHz, 210 MHz, and 800 MHz.

Figure 4:
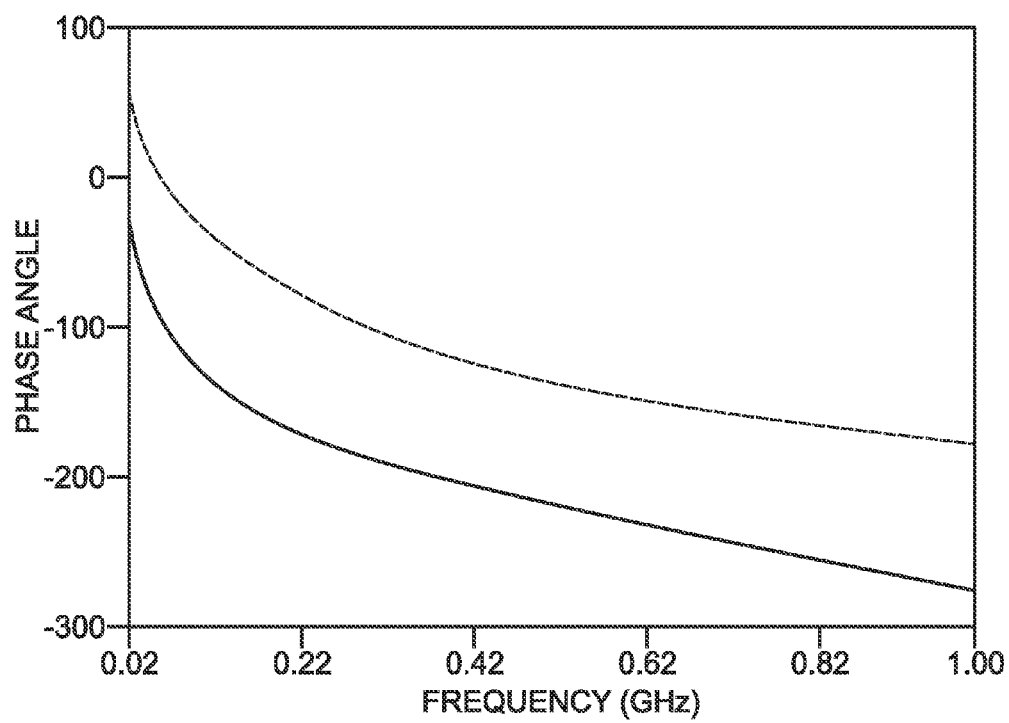
FIG. 4 is a chart illustrating phase shift as a function of frequency for coupling circuits included in an example of the phase-difference network of FIG. 3.
Figure 5:
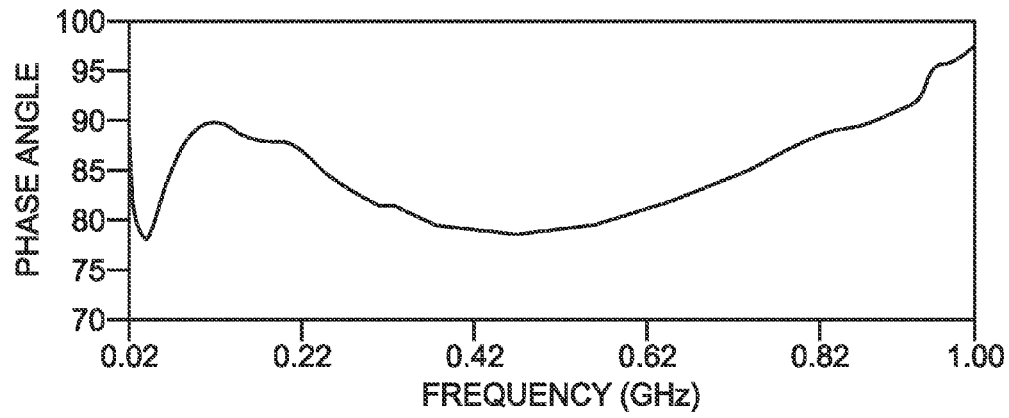
FIG. 5 is a chart illustrating phase difference as a function of frequency for two outputs of the example of the phase-difference network of FIG. 3.

When physically constructed, an embodiment of phase-shift network 186 produced signals having the phase-shifts shown by the upper curve in FIG. 4. It is seen that the phase shifts smoothly from about +50 degrees at 20 MHz to about −180 degrees at 1 GHz. On the other hand, phase-shift network 192 produced a signal having the phase characteristics illustrated by the lower curve in FIG. 4. That is, it starts at about −40 degrees phase shift at 20 MHz (0.02 GHz) and the phase shift approaches −270 degrees as the frequency approaches 1 GHz. FIG. 5 illustrates the measured difference in phases of the two output signals on outputs 196 and 198. It is seen that the phase difference varies between about 78-degrees and 98-degrees over the frequency range of 20 MHz to 1 GHz, or about +/−12-degrees from 90-degrees.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of phase-shift networks, a phase-difference network, and methods of phase shifting have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure.

An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

The invention claimed is:

1. A phase-shift network comprising:
a first capacitor connected between a first input node and a first output node;
a second capacitor connected between a second input node and a second output node, the first input node, the second input node, the first output node, and the second output node being different nodes;
a first filter section operatively connected between the first input node and the second output node; and
a second filter section operatively connected between the second input node and the first output node;
each of the first and second filter sections including an inductance and a high-pass network.

2. The phase-shift network of claim 1, wherein the high-pass network of at least one of the first and second filter sections includes third and fourth capacitors and a first inductor, the inductance of the at least one of the first and second filter sections and the third and fourth capacitors being connected in series between the respective input and output nodes, and the first inductor having a first end connected to an intermediate node between the third and fourth capacitors and a second end connected to a circuit ground.

3. The phase-shift network of claim 2, wherein the inductance includes second and third inductors disposed on opposite sides of the intermediate node in series with the third and fourth capacitors.

4. The phase-shift network of claim 2, wherein the inductance includes a second inductor connecting the respective input node to the third capacitor and a third inductor connecting the fourth capacitor to the respective output node.

5. The phase-shift network of claim 4, wherein at least one of the second and third inductors is a distributed inductor.

6. A coupling network comprising:
a first balun having a first-balun input and two first-balun outputs, for changing an unbalanced input signal received on the first-balun input into a balanced signal on the two first-balun outputs;

a second balun having two second-balun inputs and a second-balun output, for changing a balanced signal received on the two second-balun inputs to an unbalanced signal on the second-balun output; and the phase-shift network according to claim 1 coupling the two first-balun outputs to the two second-balun inputs.

7. A phase-difference network comprising:

a signal divider having a divider input and first and second divider outputs for dividing an unbalanced signal received on the divider input into two unbalanced signals on the two divider outputs;

first and second coupling networks according to claim 6, the first coupling network coupled between the first divider output for shifting the phase of a signal received on the first divider output; and the second coupling network coupled between the second divider output for shifting the phase of a signal received on the first divider output.

8. The phase-shift network of claim 1, wherein the first capacitor is disposed in a first current path extending between the first input node and the first output node that does not include the second input node or the second output node, the second capacitor is disposed in a second current path extending between the second input node and the second output node that does not include the first input node or the first output node, the first filter section is disposed in a third current path extending between the first input node and the second output node that does not include the second input node or the first output node, and the second filter section is disposed in a fourth current path extending between the second input node and the first output node that does not include the first input node or the second output node.

* * * * *